(12) United States Patent
Chen

(10) Patent No.: US 7,449,641 B2
(45) Date of Patent: Nov. 11, 2008

(54) HIGH-SPEED SIGNAL TRANSMISSION STRUCTURE HAVING PARALLEL DISPOSED AND SERIALLY CONNECTED VIAS

(75) Inventor: Yen-Hao Chen, Taipei (TW)

(73) Assignee: Inventec Corporation (TW)

( * ) Notice: Subject to any disclaimer, the term of this patent is extended or adjusted under 35 U.S.C. 154(b) by 361 days.

(21) Appl. No.: 11/492,514

(22) Filed: Jul. 24, 2006

(65) Prior Publication Data

US 2008/0017411 A1 Jan. 24, 2008

(51) Int. Cl.
*H01R 12/04* (2006.01)
*H05K 1/11* (2006.01)

(52) U.S. Cl. .............................. 174/262; 361/792

(58) Field of Classification Search ......... 174/262–266; 361/792–795

See application file for complete search history.

*Primary Examiner*—Jeremy C Norris
(74) *Attorney, Agent, or Firm*—Peter F. Corless; Steven M. Jensen; Edwards Angell Palmer & Dodge LLP

(57) ABSTRACT

A high-speed signal transmission structure having parallel disposed and serially connected vias is disclosed. The structure is applicable to a multi-layered circuit board such as a high-speed digital circuit board for forming a high-speed signal transmission circuit on the high-speed digital circuit board. The structure includes a pair of parallel disposed and serially connected vias for connecting an upper conductive circuit installed on an upper layer of the multi-layered circuit board and a lower conductive circuit installed on a lower layer of the multi-layered circuit board. Compared with the prior art, an open stub formed by the remaining portion of the vias has become shorter, thereby reducing a resonance effect affecting the quality of signal transmission.

9 Claims, 4 Drawing Sheets

HIGH-SPEED SIGNAL TRANSMISSION STRUCTURE HAVING PARALLEL DISPOSED AND SERIALLY CONNECTED VIAS

BACKGROUND OF THE INVENTION

1. Field of the Invention

This invention relates to high-speed digital circuit technology, and more particularly, to a high-speed signal transmission structure having parallel-disposed and serially-connected vias which is designed for use on a multi-layer circuit board, such as a high-speed digital circuit board, for providing a signal transmission path through the signal electrically-conductive vias that can help prevent resonance effect in the high-speed signal transmitting therethrough to thereby ensure the signal integrity of the transmitted signal.

2. Description of Related Art

With the advent of wireless digital communication technologies, such as wireless networking, mobile phones, GPS (Global Positioning System), etc., the design and manufacture of high-speed digital circuit boards that handle digital signals within the gigahertz range is in high demand in the electronics industry. In circuit layout design, high-speed digital circuit boards typically use microstrips, or striplines, for transmission of digital signals within the range of high frequencies, typically from 1 GHz to 10 GHz (gigahertz). It is to be noted that throughout this patent specification, the term "high-speed digital signal" refers to a digital signal with a frequency above 1 GHz.

High-speed digital circuits are typically constructed on a multi-layer circuit board composed of multiple circuit layers. In the multi-layer structure, signal transmission lines between different circuit layers are interconnected by way of electrically-conductive vias. FIG. 1 show a traditional high-speed signal transmission structure. As shown, this high-speed signal transmission structure is constructed on a multi-layer circuit board 10 of the type having at least one upper layer 21 and one bottom layer 22 with at least one upper reference plane 31 formed on the internal side of the upper layer 21 and one bottom reference plane 32 formed on the internal side of the bottom layer 22 (it is to be noted that FIG. 1 only demonstratively shows two circuit layers 21, 22 in the multi-layer circuit board 10; in practice, the multi-layer circuit board 10 may include more circuit layers). In layout design, this traditional high-speed signal transmission structure comprises: (a) a first electrically-conductive line 110; (b) a second electrically-conductive line 120; and (c) a via 130. The first electrically-conductive line 110 is laid in parallel with and on the external side of the upper reference plane 31 of the multi-layer circuit board 10, and which has a first end 111 and a second end 112, wherein the first end 111 is used for connection with a first electronic component (not shown). The second electrically-conductive line 120 is laid in parallel with and on the internal side of the upper reference 31 of the multi-layer circuit board 10, and which has a first end 121 and a second end 122, wherein the first end 121 is used for connection with a second electronic component (not shown).

In the above-mentioned high-speed signal transmission structure, since the first electrically-conductive line 110 is laid above the upper reference plane 31 while the second electrically-conductive line 120 is laid beneath the upper reference plane 31, it requires the provision of the via 130 which penetrates through the multi-layer circuit board 10 for interconnecting the second end 112 of the first electrically-conductive line 110 with the second end 122 of the second electrically-conductive line 120. Thus, the provision of the via 130 allows the construction of a continuous signal transmission path from the first electrically-conductive line 110 to the second electrically-conductive line 120 (the signal transmission path is indicated by a series of arrows in FIG. 1).

One drawback to the provision of the aforementioned via 130, however, is that the via 130 only has a small portion 131 (hereinafter referred to as "upper-end transmission portion") which is actually used for signal transmission, and has a lengthy portion 132 on the bottom side which effectively act as an open stub. The existence of the open stub 132 would then undesirably cause the transmitting high-speed signal to be subject to resonance and thus undesirably degrade signal integrity.

One solution to the foregoing problem is to utilize a back-drill method to remove the open stub 132 on the bottom side of the via 130. By this back-drill method, a drill (not shown) is used to bore into the open stub 132 in the bottom layer 22, thereby removing the open stub 132. In practice, however, this method has several drawbacks, such as requiring the use of drilling equipment which is costly and time-consuming to implement, and would easily cause misalignment to the multiple layers of the circuit board 10.

SUMMARY OF THE INVENTION

It is therefore an objective of this invention to provide a high-speed signal transmission structure having parallel-disposed and serially-connected vias that allow a reduction in the resonance effect caused by open stubs without having to employ the back-drill method.

To achieve the forgoing and other objectives, the invention provides a high-speed signal transmission structure having parallel-disposed and serially-connected vias. The high-speed signal transmission structure according to the invention comprises: (A) a first electrically-conductive line, which is laid on a first side of the upper reference plane of the multi-layer circuit board, and which has a first end and a second end; (B) a first via, which has an upper end and a bottom end, wherein the upper end thereof is connected to the first end of the first electrically-conductive line over the upper layer of the multi-layer circuit board, while the bottom end thereof extends to the bottom layer of the multi-layer circuit board; (C) a second electrically-conductive line, which is laid on a second side of the upper reference plane of the multi-layer circuit board in opposition to the first electrically conductive line, and which has a first end and a second end; (D) a second via, which has an upper end and a bottom end, wherein the upper end thereof is connected to the second end of the second electrically-conductive line over the upper layer of the multi-layer circuit board, while the bottom end thereof extends to the bottom layer of the multi-layer circuit board; and (E) a bottom-side connecting bridge, which is laid over the bottom layer of the multi-layer circuit board for connecting the bottom end of the first via to the bottom end of the second via.

The high-speed signal transmission structure according to the invention is designed for use on a multi-layer circuit board, such as a high-speed digital circuit board, for providing a signal transmission path through electrically-conductive vias that can help prevent resonance effect in the high-speed signal transmitting therethrough to thereby ensure the signal integrity.

The high-speed signal transmission structure according to the invention is characterized by the provision of a pair of parallel-disposed and serially-connected vias extending between the upper layer and the bottom layer of the multi-layer circuit board for interconnecting two signal lines on different layers of the circuit board, for the purpose of shorting the open stub in the signal transmission line to help prevent resonance effect and thereby ensure the integrity of the high-speed signal being transmitted therethrough.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The high-speed signal transmission structure according to the invention is disclosed in full details by way of preferred embodiments in the following with reference to the accompanying drawings.

Figure 2:
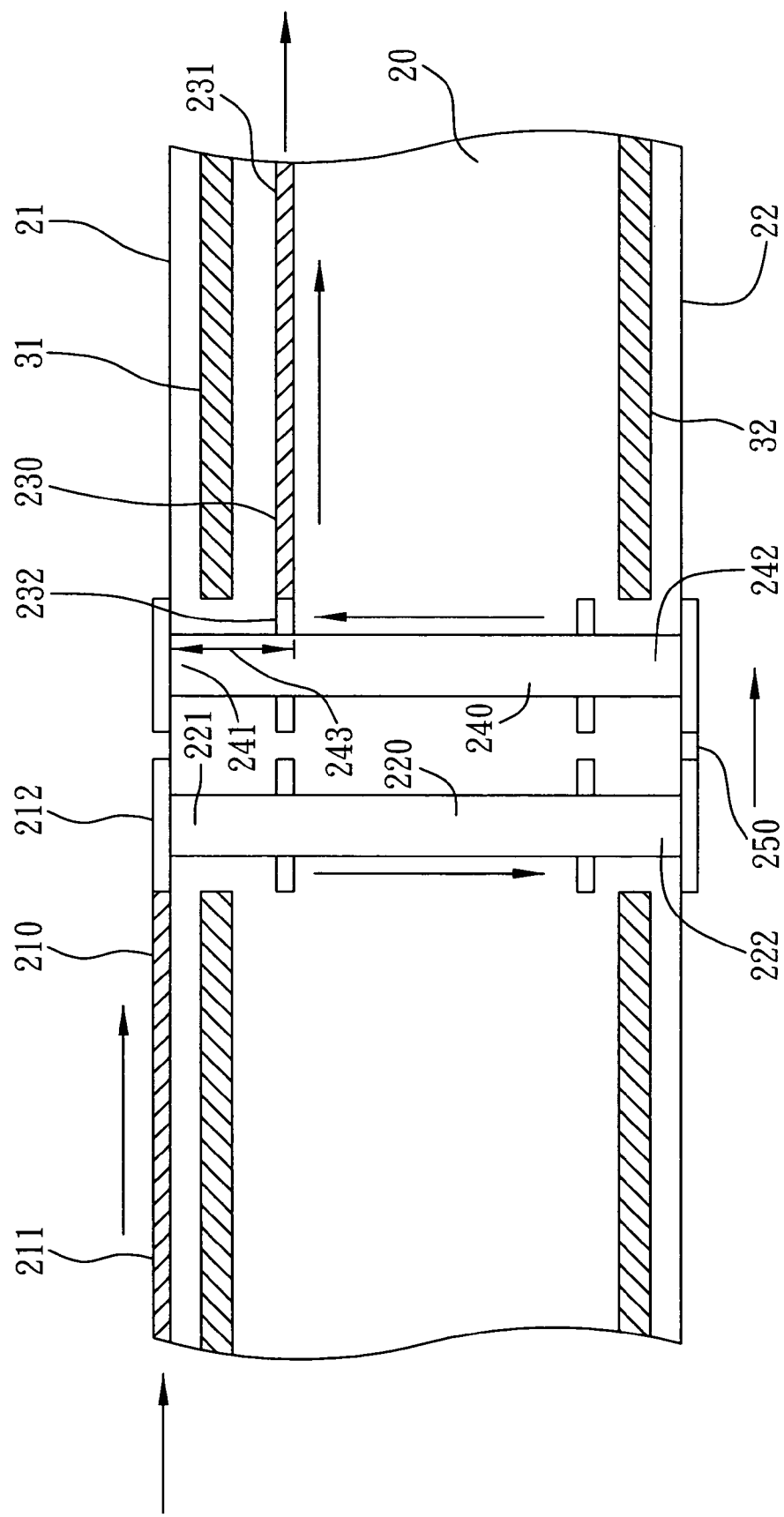
FIG. 2 is a schematic diagram showing a sectional view of the high-speed signal transmission structure according to the invention.

FIG. 2 show the application of the high-speed signal transmission structure of the invention. As shown, the high-speed signal transmission structure of the invention is designed for use on a multi-layer circuit board 20, such as a high-speed digital circuit board for wireless networking, mobile phone, GPS, or digital TV, to name just a few, where the multi-layer circuit board 20 is constructed on a multi-layer structure of the type having at least one upper layer 21 and one bottom layer 22 with at least one upper reference plane 31 formed on the internal side of the upper layer 21 and one bottom reference plane 32 formed on the internal side of the bottom layer 22 (it is to be noted that FIG. 2 only demonstratively shows two layers 21, 22 in the multi-layer circuit board 20; in practice, the multi-layer circuit board 20 may include more layers).

As shown in FIG. 2, the high-speed signal transmission structure of the invention comprises: (A) a first electrically-conductive line 210; (B) a first via 220; (C) a second electrically-conductive line 230; (D) a second via 240; and (E) a bottom-side connecting bridge 250. Firstly, the respective attributes and functions of these constituent components 210, 220, 230, 240, 250 of the high-speed signal transmission structure of the invention are described in details in the following.

The first electrically-conductive line 210 is laid in parallel with and on the external side of the upper reference plane 31 of the multi-layer circuit board 20, and which has a first end 211 and a second end 212, wherein the first end 211 is used for connection with a first electronic component (not shown), while the second end 212 is used for connection with the first via 220.

The first via 220 is an electrically-conductive passage having an upper end 221 and a bottom end 222, wherein the upper end 221 thereof is connected to the first end 211 of the first electrically-conductive line 210 over the upper layer 21 of the multi-layer circuit board 20, while the bottom end 222 thereof extends to the bottom layer 22 of the multi-layer circuit board 20.

The second electrically-conductive line 230 is laid in parallel with and on the external side of the upper reference plane 31 of the multi-layer circuit board 20 in opposition to the first electrically-conductive line 210, and which has a first end 231 and a second end 232, wherein the first end 231 is used for connection with a second electronic component (not shown), while the second end 232 is connected to the second via 240.

The second via 240 is an electrically-conductive passage having an upper end 241 and a bottom end 242, wherein the upper end 241 thereof is connected to the second end 232 of the second electrically-conductive line 230 over the upper layer 21 of the multi-layer circuit board 20, while the bottom end 242 thereof extends to the bottom layer 22 of the multi-layer circuit board 20.

The bottom-side connecting bridge 250 is an electrically-conductive line structure which is laid over the bottom layer 22 of the multi-layer circuit board 20 for electrically connecting the bottom end 222 of the first via 220 to the bottom end 242 of the second via 240.

In layout design, the above-mentioned first electrically-conductive line 210, the first via 220, the bottom-side connecting bridge 250, the second via 240, and the second electrically-conductive line 230 are interconnected to form a continuous signal transmission path which extends continuously from the first end 211 of the first electrically-conductive line 210 to the first end 231 of the second electrically-conductive line 230 (the signal transmission path is indicated by a series of arrows in FIG. 2).

In the high-speed signal transmission structure of the invention, a small part of the second via 240 that sits between the upper layer 21 and the second electrically-conductive line 230 will form an open stub 243. However, compared to the prior art of FIG. 1, it can be seen that this open stub 243 on the second via 240 is significantly shorter than the open stub 132 in the prior art.

In accordance with fundamental electromagnetism, if an open stub has a length of L and the signal being transmitted has a phase velocity of $V_p$, then the resonance frequency $f_{res}$ of the signal at the open stub is related to $V_p$ and L as follows:

$$f_{res} = \frac{V_p}{4L}$$

Therefore, it can be learned that the resonance frequency inversely is proportional to the length of the open stub, and thus a shorter open stub would result in a smaller resonance frequency.

Figure 1:
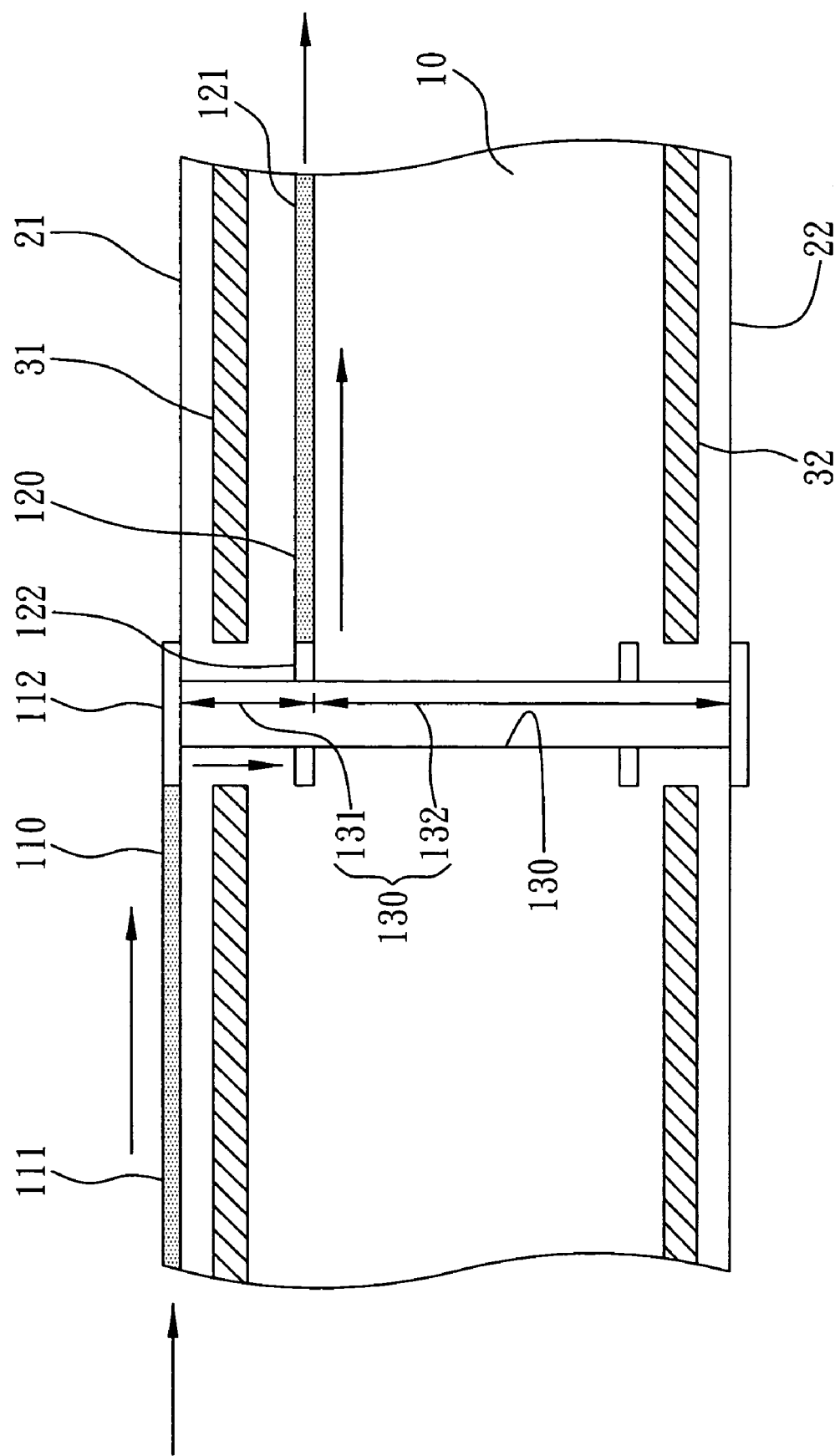
FIG. 1 (PRIOR ART) is a schematic diagram showing a sectional view of a conventional high-speed signal transmission structure.
Figure 3:
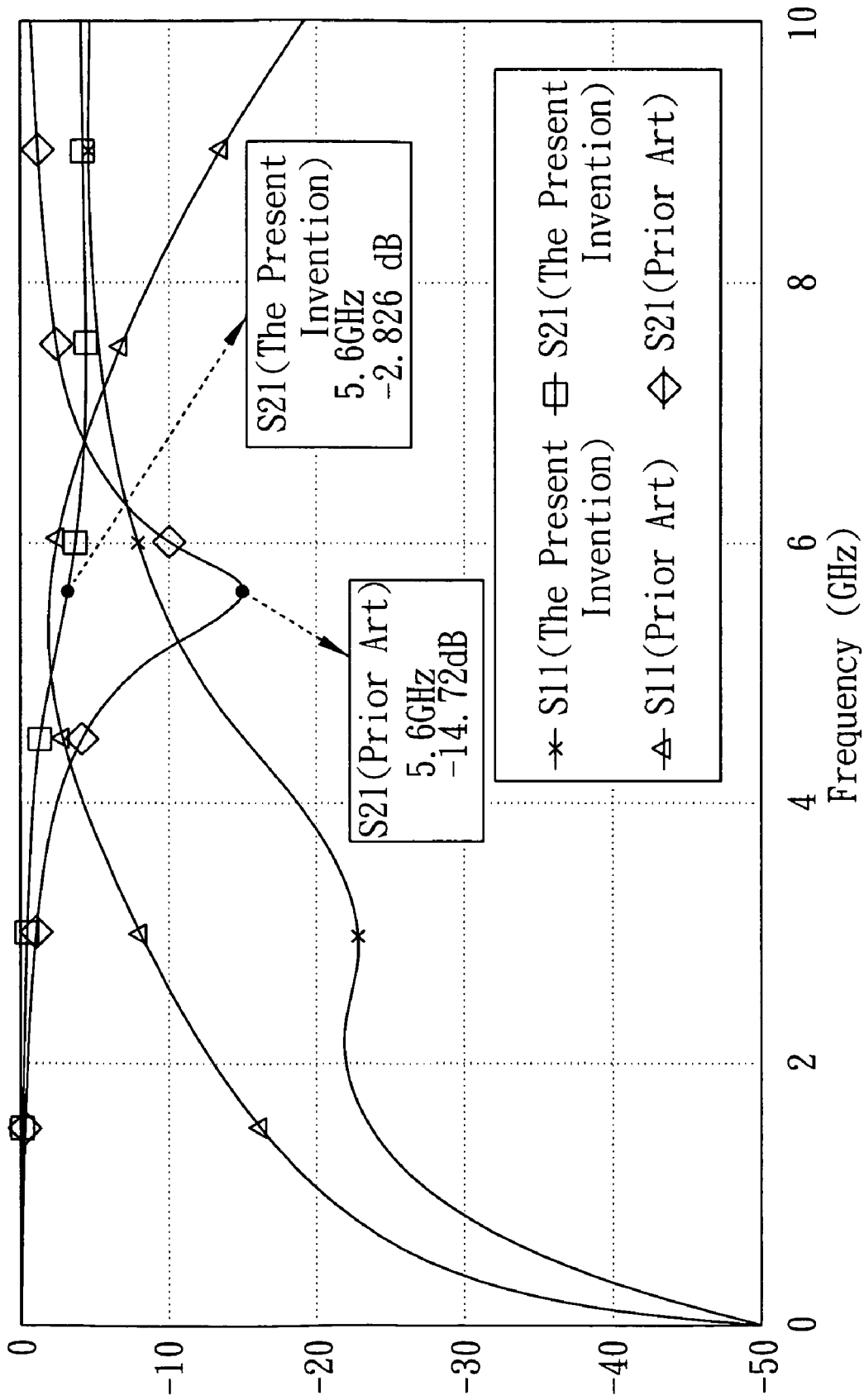
FIG. 3 is a plot showing the return loss and insertion loss versus frequency characteristics achieved by the high-speed signal transmission structure of the invention in comparison with the prior art.

FIG. 3 is a plot showing the return loss S11 and insertion loss S21 versus frequency characteristics achieved by the high-speed signal transmission structure of the invention in comparison with the prior art of FIG. 1. It can be seen from FIG. 3 that within the frequency range from 1 GHz to 7 GHz, the return loss S11 by the invention is significantly lower than the prior art, and it was quite obvious that the insertion loss S21 is much better at the resonance frequency of prior via stub, where the return loss S11 by the invention is 10-15 dB lower than the prior art, while the insertion loss S21 is 12 dB better than the prior art at the frequency of 5.6 GHz.

Figure 4:
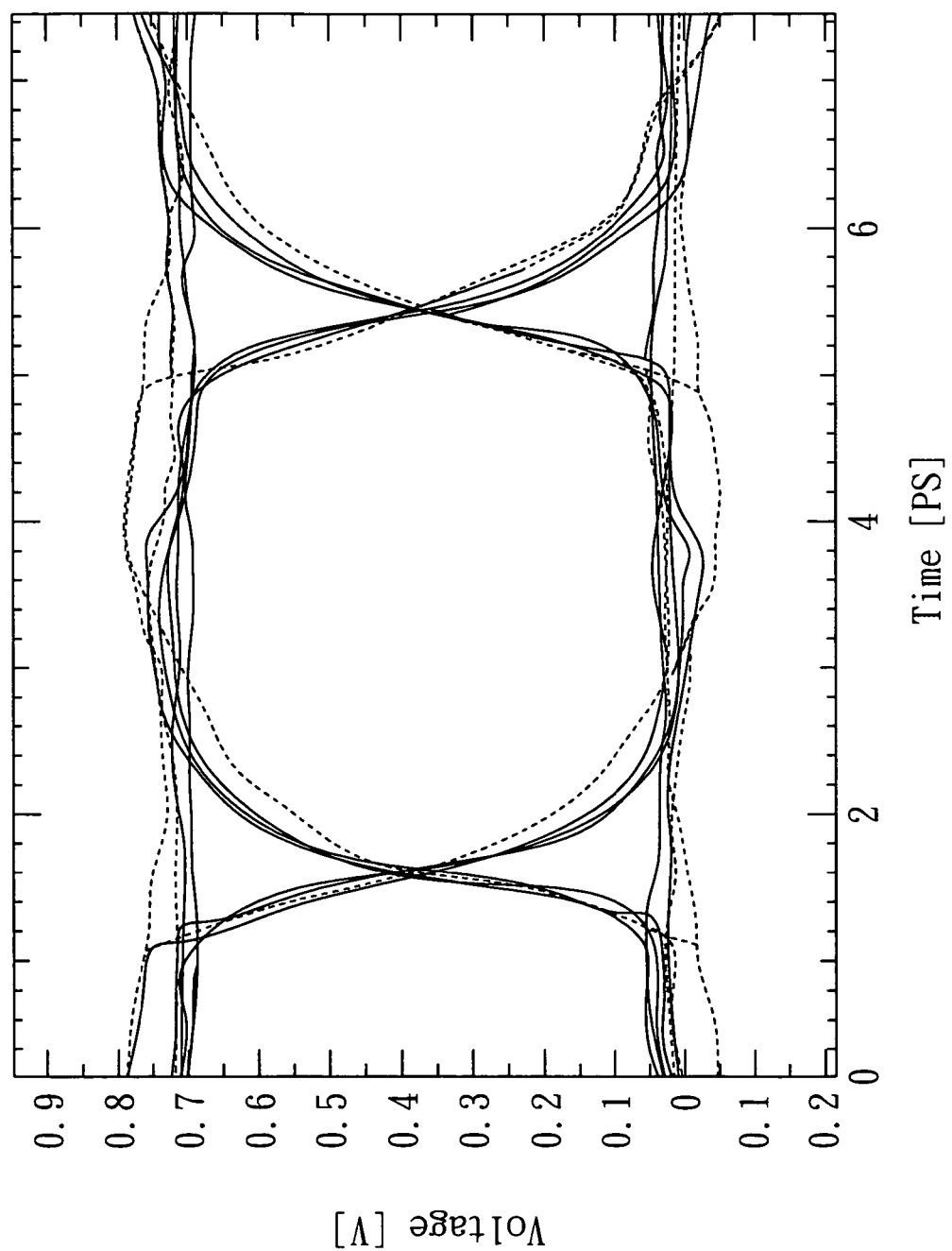
FIG. 4 is an eye diagram showing the characteristic of rise time achieved by the invention in comparison with the prior art.

FIG. 4 is an eye diagram showing the characteristic of rise time by the invention when applied to PCI-E II (PCI Express II, where PCI=Peripheral Component Interconnect) data transmission. It can be learned from the eye diagram of FIG. 4 that the prior art has a delayed rise time due to resonance at the open stubs, whereas the invention has an improved rise time over the prior art.

In conclusion, the invention provides a high-speed signal transmission structure which is designed for use on a multi-layer circuit board, such as a high-speed digital circuit board, and which is characterized by the provision of a pair of parallel-disposed and serially-connected vias extending between the upper layer and the bottom layer of the multi-layer circuit board for interconnecting two signal lines on different layers of the circuit board, for the purpose of shorting the open stub in the signal transmission line to help prevent resonance effect and thereby ensure the integrity of the high-speed signal being transmitted therethrough. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A high-speed signal transmission structure for use on a multi-layer circuit board of the type having at least one upper layer and one bottom layer with at least one upper reference plane formed on the internal side of the upper layer, for providing a high-speed signal transmission path through the multi-layer circuit board;

the high-speed signal transmission structure comprising:
   a first electrically-conductive line, which is laid on a first side of the upper reference plane of the multi-layer circuit board, and which has a first end and a second end;
   a first via, which has an upper end and a bottom end, wherein the upper end thereof is connected to the first end of the first electrically-conductive line over the upper layer of the multi-layer circuit board, while the bottom end thereof extends to the bottom layer of the multi-layer circuit board;
   a second electrically-conductive line, which is laid on a second side of the upper reference plane of the multi-layer circuit board in opposition to the first electrically conductive line, and which has a first end and a second end;
   a second via, which has an upper end and a bottom end, wherein the upper end thereof is connected to the second end of the second electrically-conductive line over the upper layer of the multi-layer circuit board, while the bottom end thereof extends to the bottom layer of the multi-layer circuit board; and
   a bottom-side connecting bridge, which is laid over the bottom layer of the multi-layer circuit board for connecting the bottom end of the first via to the bottom end of the second via.

2. The high-speed signal transmission structure of claim 1, wherein the bottom-side connecting bridge is laid on the bottom layer of the multi-layer circuit board.

3. The high-speed signal transmission structure of claim 1, wherein the first electrically-conductive line is laid on the external side of the upper reference plane in the multi-layer circuit board.

4. The high-speed signal transmission structure of claim 1, wherein the second electrically-conductive line is laid on the internal side of the bottom reference plane in the multi-layer circuit board.

5. The high-speed signal transmission structure of claim 1, wherein the multi-layer circuit board is a high-speed digital circuit board.

6. The high-speed signal transmission structure of claim 5, wherein the high-speed digital circuit board is used for wireless networking application.

7. The high-speed signal transmission structure of claim 5, wherein the high-speed digital circuit board is used for mobile phone application.

8. The high-speed signal transmission structure of claim 5, wherein the high-speed digital circuit board is used for GPS (Global Positioning System) application.

9. The high-speed signal transmission structure of claim 5, wherein the high-speed digital circuit board is used for digital TV application.

* * * * *